United States Patent
Wu

[19]

[11] Patent Number: 6,127,706
[45] Date of Patent: *Oct. 3, 2000

[54] TRENCH-FREE BURIED CONTACT FOR SRAM DEVICES

[75] Inventor: Shye-Lin Wu, Hsinchu, Taiwan

[73] Assignee: Texas Instruments - Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/065,323

[22] Filed: Apr. 23, 1998

[51] Int. Cl.[7] .......................... H01L 29/76; H01L 29/94; H01L 31/062; H01L 31/113; H01L 31/119
[52] U.S. Cl. .......................... 257/382; 257/383; 257/384; 257/385; 257/336; 257/344; 257/408
[58] Field of Search .................... 257/344, 903, 257/408, 382, 383, 384, 385, 336

[56] References Cited

U.S. PATENT DOCUMENTS

| | | |
|---|---|---|
| 4,701,423 | 10/1987 | Szluk . |
| 4,835,740 | 5/1989 | Sato ........................................ 257/344 |
| 5,082,796 | 1/1992 | El-Diwany et al. . |
| 5,146,309 | 9/1992 | Spinner et al. ........................... 357/59 |
| 5,580,806 | 12/1996 | Chang et al. . |
| 5,596,215 | 1/1997 | Huang ..................................... 257/382 |
| 5,619,055 | 4/1997 | Meguro et al. ......................... 257/903 |
| 5,705,437 | 1/1998 | Wu et al. . |
| 5,742,088 | 4/1998 | Pan et al. ................................ 257/382 |
| 5,751,640 | 5/1998 | Gil .......................................... 257/903 |
| 5,844,284 | 12/1998 | Liu ......................................... 257/382 |

OTHER PUBLICATIONS

Shye Lin Wu et al., Characterization of Thin Textured Tunnel Oxide Prepared by Thermal Oxidation of Thin Polysilicon Film on Silicon, IEEE Transactions on Electron Devices, vol. 43, No. 2, Feb. 1996, pp. 287–294.

*Primary Examiner*—David Hardy
*Assistant Examiner*—Jesse A. Fenty
*Attorney, Agent, or Firm*—Harness, Dickey & Pierce, P.L.C.

[57] ABSTRACT

A buried contact structure on a semiconductor substrate in the present invention is as follows. A gate insulator is on a portion of the substrate and a gate electrode is located over the gate insulator. A gate sidewall structure is on the sidewall of the gate electrode. A lightly doped junction region in the substrate is under the gate sidewall structure. A doped junction region is in the substrate abutting the lightly doped junction region and is located aside from the gate insulator. A doped buried contact region is in the substrate next to the doped junction region. An interconnect is located over a first portion of the doped buried contact region.

The buried contact structure can further include a shielding layer over a second portion of the doped buried contact region. For forming more connections, the buried contact structure can further have a dielectric layer over the interconnect, the substrate, the gate sidewall structure, and the gate electrode. A interconnect structures are located in the dielectric layer and have electrical contacts with the interconnect and the gate electrode.

19 Claims, 4 Drawing Sheets

TRENCH-FREE BURIED CONTACT FOR SRAM DEVICES

FIELD OF THE INVENTION

The present invention relates to semiconductor device structure and manufacturing processes, and more specifically, to a trench-free buried contact for SRAM (static random access memory) devices.

BACKGROUND OF THE INVENTION

From the first invention of integrated circuits in 1960, the number of devices on a chip has grown in an explosive increasing rate. The technologies of the semiconductor industry has been researched continuously for almost four decades. The progress of the semiconductor integrated circuits has step into ULSI (ultra large scale integration) level or even higher level. The capacity of a single semiconductor chip increases from several thousand devices to hundreds of million devices, or even billions of devices. The integrated circuits devices like transistors, capacitors, and connections must be greatly narrowed simultaneously.

The increasing packing density of the integrated circuits generates numerous challenges to the semiconductor manufacturing process. Every device needs to be formed within smaller size without damaging the characteristics and the operations. The demands on high packing density and low heat generation devices with good reliability and long operation life must be maintained without any degradation in their functions.

All the challenges and demands in fabrication are expected to be solved with the four key aspects of the semiconductor manufacturing, including the lithography, the film formation, the etching, and the diffusion processing technologies. The continuous increase in the packing density of the integration circuits must be accompanied with a smaller feature size. In addition to chip area and functional considerations, all the devices with smaller size must be achieved with simplified and reliable manufacturing steps to raise the yield and reduce the cost of products.

In the application of memory devices, SRAM device plays a vital role as a semiconductor storage cell in which the stored data can be latched without degradation. Typically, a SRAM cell is composed of bistable transistor flip-flops which can be implemented in various configurations. MOS (metal oxide semiconductor) transistors or bipolar transistors are used in the bistable transistor flip-flops. The SRAM cell utilizes more transistors than a typical DRAM (dynamic random memory) cell which has one transistor and one capacitor. With more transistors employed in forming memory arrays, the packing density of the SRAM array is of great consideration. The packing density must be raised greatly to include more memory cells in a single chip.

The buried contact technology, which utilizes doped polycrystalline silicon or titanium nitride (TiN) layers for local interconnect, has been widely applied to the modem integrated circuits, such as SRAM and BiCMOS devices. In U.S. Pat. No. 4,701,423 to N. J. Szluk, a totally self-aligned CMOS process is disclosed. It is disclosed that the buried contacts or self-aligned buried contacts is one of the beneficial structures in improving device performance and device density. However, it is difficult to implement the buried contacts with some other beneficial structures like LDD (lightly doped drain), gate/conductor doping, and self-aligned contacts. The process complexity is increased and the device yields is hard to maintain. A CMOS process which incorporates lightly doped drain-source structures, sidewall oxide structures and self-aligned contacts is disclosed in the invention.

M. H. El-Downy et al disclose the use of polysilicon layer for local interconnect in a CMOS or BiCMOS technology incorporating sidewall spacers in U.S. Pat. No. 5,082,796. It is addressed that the number of metal layers formed on a given portion of a wafer is limited. Therefore, the use of a polysilicon layer for local interconnect allows the metal layer that was formerly used for local interconnect to be employed as an additional global connection layer. The use of a polysilicon layer to form device contacts also results in an improvement in transistor performance through reduction in device parasitic areas.

The buried contacts provide the electrical interconnection among gate electrodes, drain regions of the cross-coupled MOS transistors and source/drain regions of the transmission-gate transistors. However, the typical buried contacts has a major problem in the formation of the buried contact trench which interrupts the transistor current flow path causing device failure.

In U.S. Pat. No. 5,580,806 to T. T. Chang et al, a method of fabricating a buried contact structure for SRAM is disclosed. The buried contacts are used in a MOS SRAM cell, which employs two loads and two cross-coupled MOS transistors to connect each gate electrode to the drain region of the opposing cross-coupled MOS transistors. The trench formation problem in conventional application of the buried contact technology is also illustrated in the invention. The resistance is increased under the reduction of the impurity dosage.

Y. H. Wu et al disclose a trench free process for SRAM in U.S. Pat. No. 5,705,437. The formation of undoped region or trench is introduced to increase the electrical resistivity or leakage problem. However, the conventional processes in solving the trench formation problem generally incorporate complicated processing steps. The efforts needed in fabrication is thus increased as well as the cost. What is needed is a method to form trench-free buried contacts with simplified process.

SUMMARY OF THE INVENTION

A trench-free buried contact for SRAM devices is disclosed in the present invention. A simpler process than conventional buried contact process is also provided.

A buried contact structure on a semiconductor substrate in the present invention is as follows. A gate insulator is on a portion of the substrate and a gate electrode is located over the gate insulator. A gate sidewall structure is on the sidewall of the gate electrode. A lightly doped junction region in the substrate is under the gate sidewall structure. A doped junction region is in the substrate abutting the lightly doped junction region and is located aside from the gate insulator. A doped buried contact region is in the substrate next to the doped junction region. An interconnect is located over a first portion of the doped buried contact region.

The buried contact structure can further include a shielding layer over a second portion of the doped buried contact region. For forming more connections, the buried contact structure can further have a dielectric layer over the interconnect, the substrate, the gate sidewall structure, and the gate electrode. A interconnect structures are located in the dielectric layer and have electrical contacts with the interconnect and the gate electrode.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A trench-free buried contact for SRAM devices is disclosed in the present invention. A more simplified process than conventional buried contact process is also provided. With the device structure disclosed, the packing density in forming SRAM or BiCMOS transistors can be increased with less efforts in processing steps.

Figure 1:
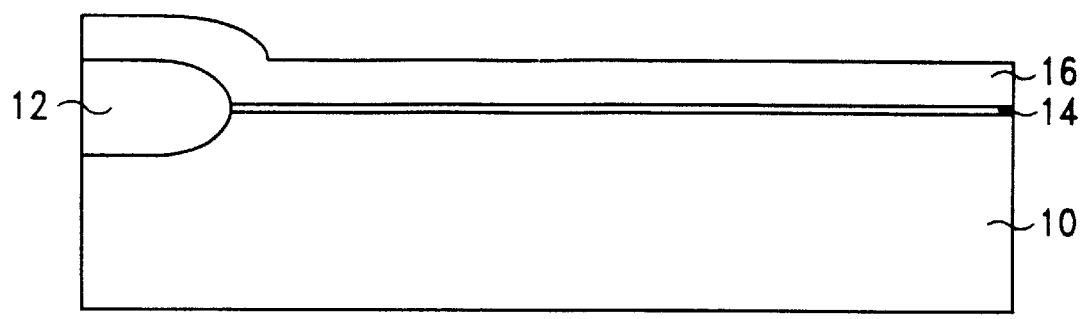
FIG. 1 illustrates a cross sectional view of forming a gate insulator layer and a first silicon layer on a substrate in accordance with the present invention.

Referring to FIG. 1, a semiconductor substrate 10 with a preferable single crystalline silicon in a <100> direction is provided. For different applications or specifications, a substrate with different crystalline orientations or materials can be used alternatively. An isolation region using field oxide isolation 12 or other isolation technology like trench isolation (not shown) is formed on the substrate 10. A gate insulator layer 14 is formed over the substrate 10. In the case, a thin oxide layer can be used. The oxide layer 14 can be thermally grown from the substrate 10 with a thickness ranging from about 50 angstroms to 400 angstroms. A wet oxidation or a dry oxidation process can be employed to grow the oxide layer 14.

A first silicon layer 16 is then formed over the gate insulator layer 14. The first silicon layer 16 can be an undoped poly-crystalline silicon layer which is utilized as a portion of the gate electrode. The undoped poly-crystalline silicon layer 16 can be formed by chemical vapor deposition with silicon containing reactants.

Figure 2:
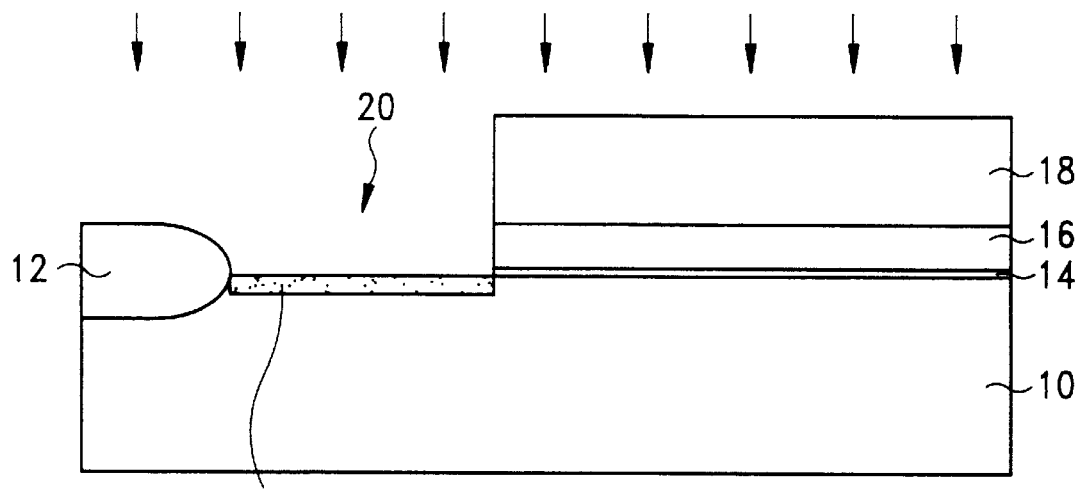
FIG. 2 illustrates a cross sectional view of defining a buried contact opening through the first silicon layer and the gate insulator layer down to the substrate in accordance with the present invention.

Referring to FIG. 2, a buried contact opening 20 is defined through the first silicon layer 16 and the gate insulator layer 14 down to the substrate 10. The buried contact opening 20 can be defined by a patterning process which is well known in the art. A photoresist layer 18 can be formed over the first silicon layer 16. The photoresist layer 18 is then defined with the transfer of mask pattern by a lithography process. After the photoresist layer 18 is developed, it is used as a mask in etching the first silicon layer 16 and the gate insulator layer 14. A reactive ion etching (RIE) can be performed preferably to form the buried contact opening 20.

The substrate 10 is then doped for forming a buried contact region 22 under the buried contact opening 20. An ion implantation can be performed using the photoresist layer 18 as a mask. Dopants like phosphorus or arsenic containing dopants can be implanted to form the n-doped buried contact region 22. The dopants can be implanted at an energy between about 10 KeV to 100 KeV to have a dose between about 5E14 to 5E16 atoms/cm$^2$.

Figure 3:
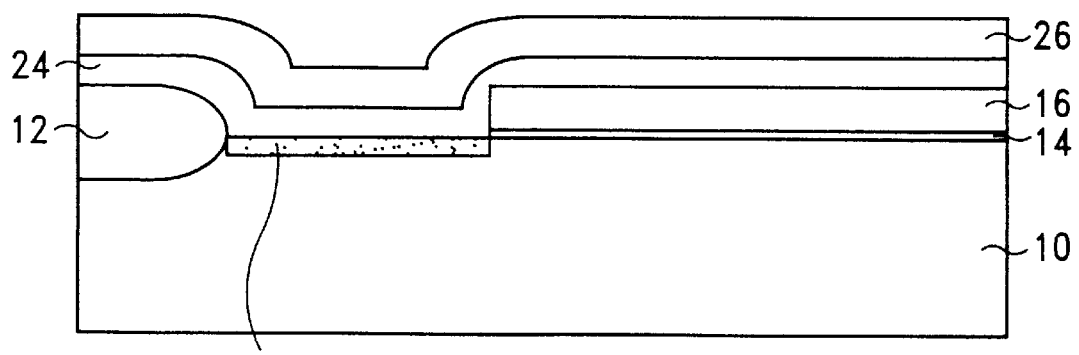
FIG. 3 illustrates a cross sectional view of forming a second silicon layer and a masking layer in accordance with the present invention.

A second silicon layer 24 is then formed over the substrate 10 and the first silicon layer 16, as shown in FIG. 3. In the case, the second silicon layer 24 is an undoped poly-crystalline silicon layer. The undoped poly-crystalline silicon layer is also formed by chemical vapor deposition. Following with the formation of the second silicon layer 24, a masking layer 26 is then formed over. A nitride layer can be used as a masking layer 26 to serve as a hard mark in the etching processes performed later. The nitride layer is formed by chemical vapor deposition.

Figure 4:
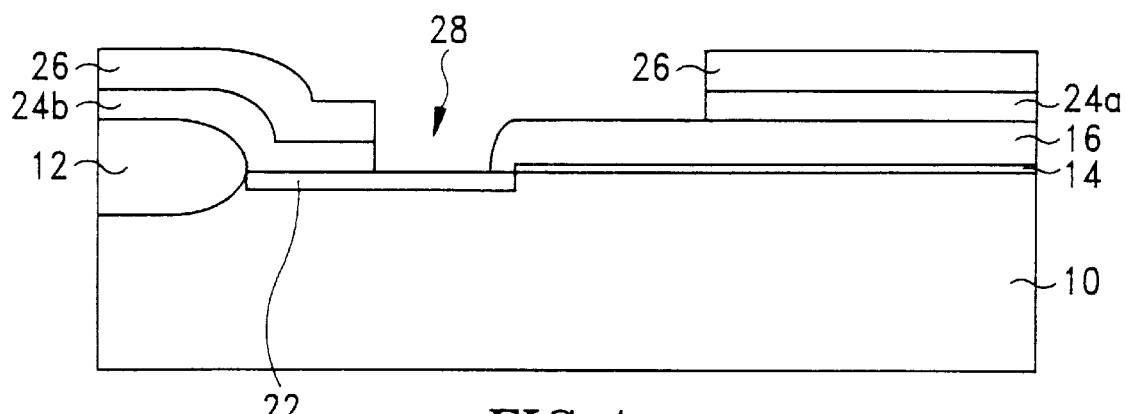
FIG. 4 illustrates a cross sectional view of defining a shielding opening, an upper gate electrode, and an interconnect by removing a portion of the second silicon layer in accordance with the present invention.

Referring to FIG. 4, a shielding opening 28 is defined through the masking layer 26 and the second silicon layer 24, down to a portion of the buried contact region 22. An upper gate electrode 24a and an interconnect 24b are defined at the same time by removing a portion of the masking layer 26 and the second silicon layer 24. A well known patterning process can be used to define the portion to etch-off by the lithography process and the etching process.

Figure 5:
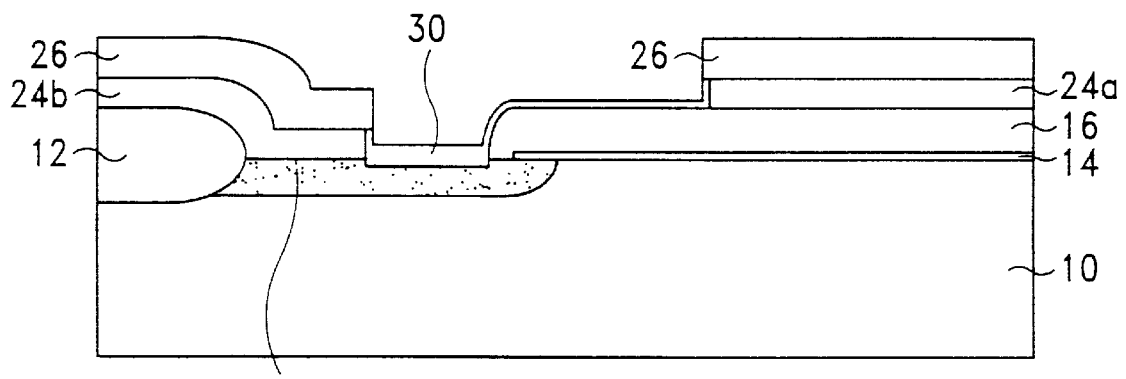
FIG. 5 illustrates a cross sectional view of forming a shielding layer in the shielding opening over the buried contact region in accordance with the present invention.

A shielding layer 30 is formed in the shielding opening 28 over the buried contact region 22, as shown in FIG. 5. The shielding layer 30 is utilized as a mask to prevent the buried contact region 22 from etching. Thus the buried contact region 22 can be protected and the trench problem in the conventional process can be eliminated. In the case, the shielding layer 30 is formed by oxidizing an exposed portion of the substrate 10 to form an oxide layer. The oxidization can be performed with a thermal process with the presentation of oxygen, steam, or both. An oxide layer is also formed on the exposed surface of the first silicon layer 16. Since the buried contact region 22 is heavily doped, the oxidation rate at the region is much higher than the undoped first silicon layer 16. Thus, the oxide layer grown on the buried contact region 22 is found to be much thicker than that grown on the first silicon layer 16, as shown in the figure.

S. L. Wu (the inventor of the present invention) and his co-workers disclose the dependence of the oxidization rate on the implantation dose in the work: "Characterization of Thin Textured Tunnel Oxide Prepared by Thermal Oxidation of Thin Polysilicon Film on Silicon" (in IEEE Transactions on Electron Devices, vol. 43, p. 287, 1996). The oxidization rate of doped substrate is found to be more than twice faster than the undoped one, as the dose of dopants is raised to about 1E15 to 1E16 atoms/cm$^2$.

Figure 6:
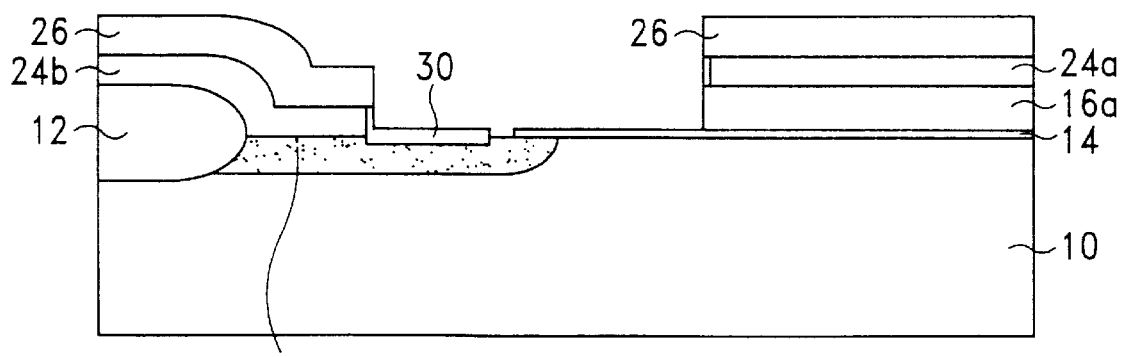
FIG. 6 illustrates a cross sectional view of defining a lower gate electrode by removing a portion of the first silicon layer in accordance with the present invention.

Referring to FIG. 6, a lower gate electrode 16a is then defined by removing a portion of the first silicon layer 16. Using the masking layer 26 as a mask, a reactive ion etching process is performed. With the protection of the shielding layer 30, the buried contact region 22 is kept from etching and the formation of a recessed trench region can be prevented. The upper gate electrode 24a and the lower gate electrode 16a are combined as the gate electrode of a transistor.

Figure 7:
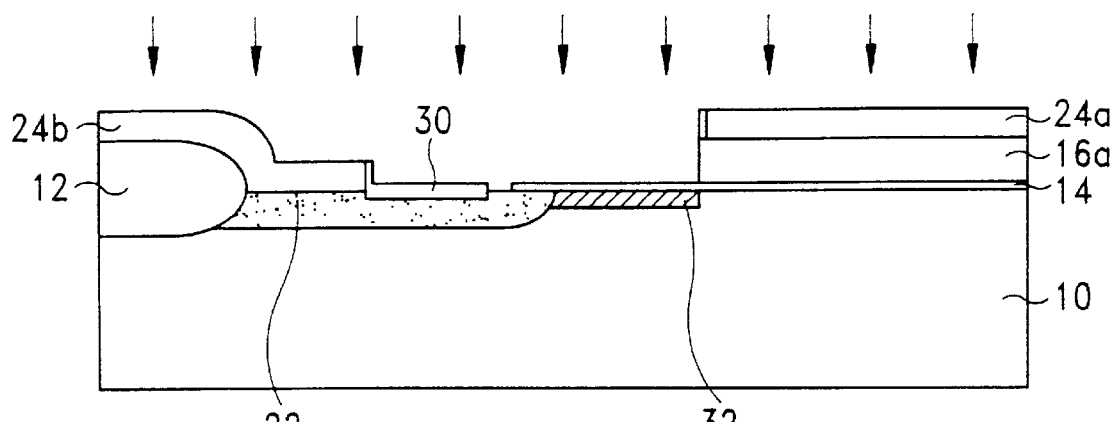
FIG. 7 illustrates a cross sectional view of doping the substrate for forming a second doping region in accordance with the present invention.

The masking layer 26 is then removed, as shown in FIG. 7. Typically, a wet etching process with hot phosphoric acid can be performed. Next, the substrate 10 are doped for forming a second doping region 32 under a region uncovered by the upper gate electrode 24a and the interconnect 24b. The upper gate electrode 24a, the lower gate electrode 16a, and the interconnect 24b are also doped as well. The second doping region 32 is a lightly doped drain/source (LDD) region for a transistor structure. An ion implantation can be performed with dopants like phosphorus or arsenic containing dopants. The dopants can be implanted at an energy between about 10 KeV to 80 KeV to have a dose between about 5E12 to 5E14 atoms/cm$^2$.

Figure 8:
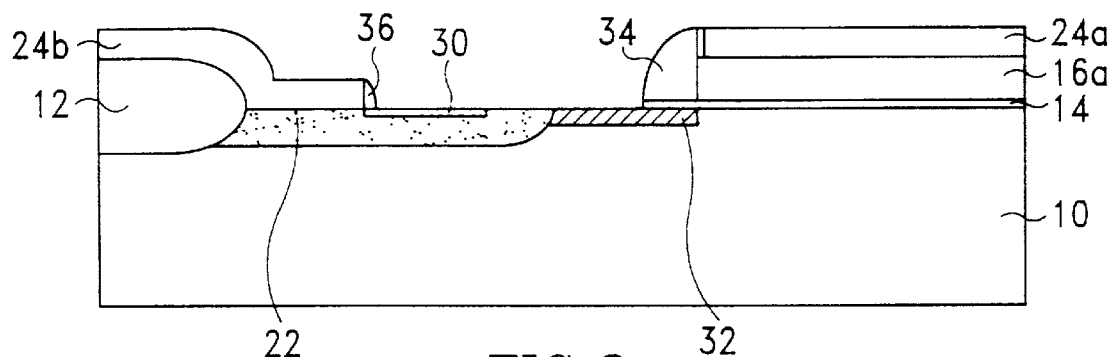
FIG. 8 illustrates a cross sectional view of forming a sidewall structure on the sidewall of the upper gate electrode and the lower gate electrode in accordance with the present invention.

Turning to FIG. 8, a sidewall structure 34 is formed on the sidewall of the upper gate electrode 24a and the lower gate electrode 16a. The sidewall structure 34 can be oxide spacers which are formed by depositing and etching back an oxide layer. A small oxide spacer 36 may also be formed on the sidewall of the interconnect 24b at the same time.

Figure 9:
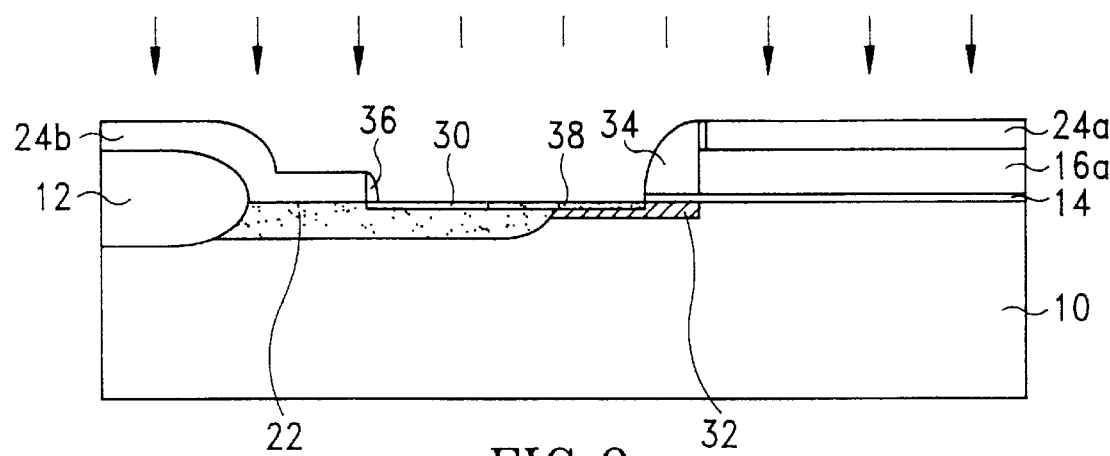
FIG. 9 illustrates a cross sectional view of doping the substrate for forming a third doping region in the second doping region in accordance with the present invention.

The substrate is then doped for forming a third doping region 38 in the second doping region 32 under a region uncovered by the sidewall structure 34, as shown in FIG. 9. The upper gate electrode 24a, the lower gate electrode 16a, and the interconnect 24b are also doped as well to be highly conductive. The third doping region 38 serves as a source/drain junction region with a high dose for the transistor. An ion implantation can be performed using the sidewall structure 34 as a mask. Dopants like phosphorus or arsenic containing dopants can be implanted to form the junction region 38. The dopants can be implanted at an energy between about 10 KeV to 100 KeV to have a dose between about 5E14 to 5E16 atoms/cm$^2$.

Figure 10:
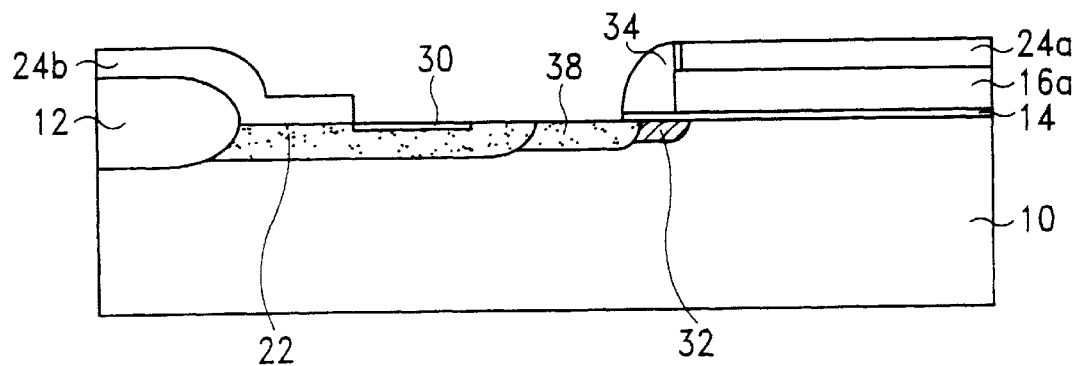
FIG. 10 illustrates a cross sectional view of the substrate after a thermal process is performed in accordance with the present invention.

Referring to FIG. 10, a thermal process is then performed. The dopants in the buried contact region 22, the second doping region 32, and the third doping region 38 are diffused and activated with the thermal process. In general, a rapid thermal process (RTP) can be performed. Thus the buried contact region 22 is formed and is electrically conductive with the junction region 38 without any high resistance barrier in-between. The trench formation problem in the conventional process can be eliminated. A trench free buried contact is provided with benefits on conductivity and reliability.

Figure 11:
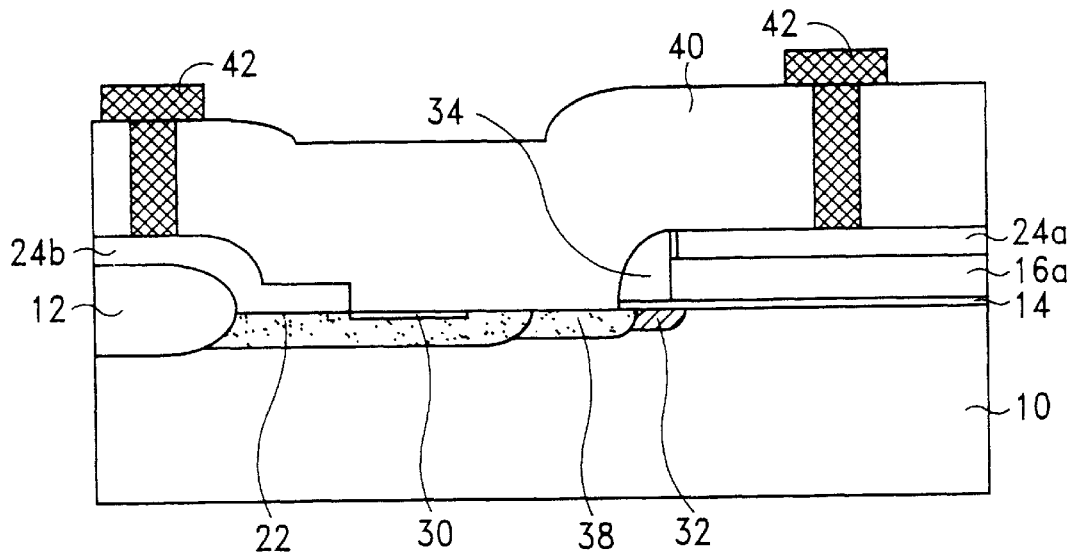
FIG. 11 illustrates a cross sectional view of forming interconnect structures over the substrate in accordance with the present invention.

In addition to the local interconnections formed by buried contacts, one or more layers of global interconnections can be formed over the substrate 10. Referring to FIG. 11, a dielectric layer 40 is formed over the substrate 10 after the thermal process. In general, a chemical vapor deposited oxide layer can be utilized as the dielectric layer 40. A metallization process is then performed for forming interconnect structures like the conductive structure 42.

Therefore, the buried contact structure of the present invention is finished with the above processes. Referring to FIG. 10, the buried contact structure has following elements. A gate insulator 14 is on a portion of the substrate 10 and a gate electrode with the lower electrode 16a and the upper electrode 24a is located over the gate insulator 14. A gate sidewall structure 34 is on the sidewall of the gate electrode. A lightly doped junction region 32 in the substrate is under the gate sidewall structure 34. A doped junction region 38 is in the substrate 10 abutting the lightly doped junction region 32 and is located aside from the gate insulator 14. A doped buried contact region 22 is in the substrate 10 next to the doped junction region 38. An interconnect 24b is located over a first portion of the doped buried contact region 22.

The buried contact structure can further include a shielding layer 30 over a second portion of the doped buried contact region 22. For forming more connections, the buried contact structure can further have a dielectric layer 40 over the interconnect 24b, the substrate 10, the gate sidewall structure 34, and the gate electrode. Interconnect structures 42 are located in the dielectric layer 40 and have electrical contacts with the interconnect 24b and the gate electrode.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A buried contact structure on a semiconductor substrate, said buried contact structure comprising:

a gate insulator over a portion of said substrate;

a gate electrode over said gate insulator;

a gate sidewall structure on the sidewall of said gate electrode;

a lightly doped junction region in said substrate under said gate sidewall structure;

a doped junction region in said substrate abutting said lightly doped junction region, said doped junction region being located aside from said gate insulator and extended outward from said lightly doped junction region;

a doped buried contact region having a planar top surface with a profile without trench in said substrate being formed next to said doped junction region and extended outward from said doped junction region to an isolation region;

a silicon interconnect layer on said isolation region and on a first portion of said doped buried contact region locating at the edge abutting said isolation region; and a shielding layer of silicon oxide on a second portion of said planar top surface of said doped buried contact region uncovered by said silicon interconnect layer, a lateral side of said shielding layer being justified with and uncovered an inner lateral side of said silicon interconnect layer, thereby preventing said doped buried contact region from etching and providing said planar top surface of without trench.

2. The buried contact structure of claim 1, wherein said shielding layer comprises a thermally grown oxide layer.

3. The buried contact structure of claim 1 further comprising:

a dielectric layer over said interconnect, said substrate, said gate sidewall structure, and said gate electrode; and interconnection structures in said dielectric layer having electrical contacts with said interconnect and said gate electrode.

4. The buried contact structure of claim 1, wherein said gate insulator comprises a gate oxide layer.

5. The buried contact structure of claim 1, wherein said gate electrode comprises a lower electrode and an upper electrode stacked over.

6. The buried contact structure of claim 5, wherein said lower electrode comprises a silicon layer.

7. The buried contact structure of claim 5, wherein said upper electrode comprises a silicon layer.

8. The buried contact structure of claim 1, wherein said gate sidewall structure comprises oxide spacers.

9. The buried contact structure of claim 1, wherein said lightly doped junction region contains phosphorus or arsenic containing dopants at a dose between about 5E12 to 5E14 atoms/cm$^2$.

10. The buried contact structure of claim 1, wherein said junction region contains phosphorus or arsenic containing dopants at a dose between about 5E14 to 5E16 atoms/cm$^2$.

11. The buried contact structure of claim 1, wherein said buried contact region contains phosphorus or arsenic containing dopants at a dose between about 5E14 to 5E16 atoms/cm$^2$.

12. A buried contact structure on a semiconductor substrate, said buried contact structure comprising:

a gate insulator over a portion of said substrate;

a gate electrode over said gate insulator;

a gate sidewall structure on the sidewall of said gate electrode;

a lightly doped junction region with phosphorus or arsenic containing dopants in said substrate under said gate sidewall structure;

a doped junction region with said phosphorus or said arsenic containing dopants in said substrate abutting said lightly doped junction region, said doped junction region located aside from said gate insulator and extended outward from said lightly doped junction region;

a doped buried contact region having a planar top surface with a profile without trench formed with said phosphorus or said arsenic containing dopants in said substrate, said doped buried contact region being formed next to said doped junction region and extended outward from said doped junction region to an isolation region;

a silicon interconnect layer on said isolation region and on a first portion of said doped buried contact region locating at the edge abutting said isolation region; and a shielding layer of silicon oxide for preventing said buried contact region from etching thereby providing said planar top surface of without trench, said shielding layer being on a second portion of said planar top surface of said doped buried contact region uncovered by said silicon interconnect layer, a lateral side of said shielding layer being justified with and uncovered an inner lateral side of said silicon interconnect layer.

13. The buried contact structure of claim 12 further comprising:

a dielectric layer over said interconnect, said substrate, said gate sidewall structure, and said gate electrode; and interconnection structures in said dielectric layer having electrical contacts with said interconnect and said gate electrode.

14. The buried contact structure of claim 12, wherein said gate insulator comprises a gate oxide layer.

15. The buried contact structure of claim 12, wherein said gate electrode comprises a lower electrode and an upper electrode stacked over, said lower electrode and said upper electrode comprising silicon layers.

16. The buried contact structure of claim 12, wherein said gate sidewall structure comprises oxide spacers.

17. The buried contact structure of claim 12, wherein said lightly doped junction region has a dose between about 5E12 to 5E14 atoms/cm$^2$ of said dopants.

18. The buried contact structure of claim 12, wherein said junction region has a dose between about 5E14 to 5E16 atoms/cm$^2$ of said dopants.

19. The buried contact structure of claim 12, wherein said buried contact region has a dose between about 5E14 to 5E16 atoms/cm$^2$ of said dopants.

* * * * *